United States Patent [19]

Battey et al.

[11] Patent Number: 4,717,806
[45] Date of Patent: Jan. 5, 1988

[54] PLASMA REACTOR AND METHODS FOR USE

[76] Inventors: James F. Battey, 66 Yerba Buena Ave., Los Altos, Calif. 94022; Perry A. Diederich, 243 MacKintosh St., Fremont, Calif. 94538

[21] Appl. No.: 866,168

[22] Filed: May 22, 1986

Related U.S. Application Data

[63] Continuation-in-part of Ser. No. 698,357, Feb. 5, 1985.

[51] Int. Cl.⁴ .............................................. B23K 9/00
[52] U.S. Cl. .................... 219/121 PE; 219/121 PG; 219/121 PQ; 156/345; 156/646
[58] Field of Search ................ 219/121 PD, 121 PE, 219/121 PG, 121 PF, 121 PR, 121 PQ; 156/345, 643, 646; 204/298, 192 E, 192 N; 427/34

[56] References Cited

U.S. PATENT DOCUMENTS

| | | | |
|---|---|---|---|
| 4,123,663 | 10/1978 | Horiike | 219/121 P |
| 4,151,034 | 4/1979 | Yamamoto et al. | 219/121 PG |
| 4,304,983 | 12/1981 | Pierfederici | 219/121 PG |
| 4,362,632 | 12/1982 | Jacob | 219/121 P |

FOREIGN PATENT DOCUMENTS

| | | | |
|---|---|---|---|
| 0047663 | 3/1982 | European Pat. Off. | 219/121 PG |
| 3102174 | 12/1981 | Fed. Rep. of Germany | 156/643 |

*Primary Examiner*—M. H. Paschall

[57] ABSTRACT

A plasma reactor comprises a working chamber that has at least one entry port. The working chamber is adapted to receive at least one article The entry port is adapted to receive a working gas into the working chamber. An electrical energy generator is provided. The plasma reactor includes at least one pair of electrodes which are positioned adjacent the working chamber entry port. The electrodes, which are connected to the generator, create an electric field adjacent the entry port that converts the working gas into a working plasma for interacting with a material of the article. The article to be processed is placed in a part of the working chamber which is free from electric fields. An electric field-free region downstream of the plasma generating region is provided in which the article is positioned. A plasma constraint member is provided to direct substantially all of the plasma flow through the articles held on said constraint member. The plasma reactor can be used to clean organic scums, films or epoxy glass from circuit boards and magnetic recording discs. With ammonia as the plasma, the reactor can be used to case harden alloys.

37 Claims, 4 Drawing Figures

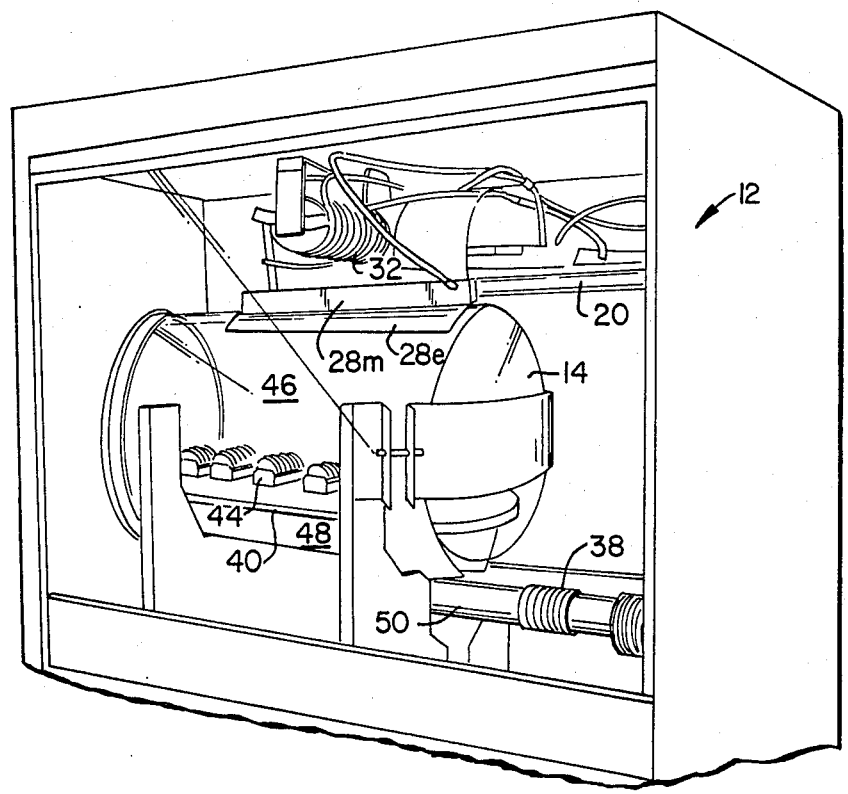
FIG.—1.
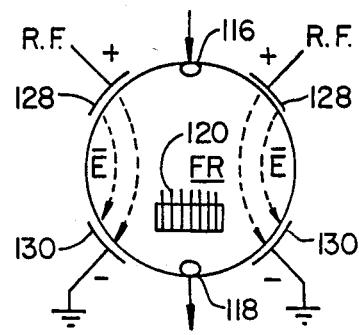
FIG.—2.
(PRIOR ART)

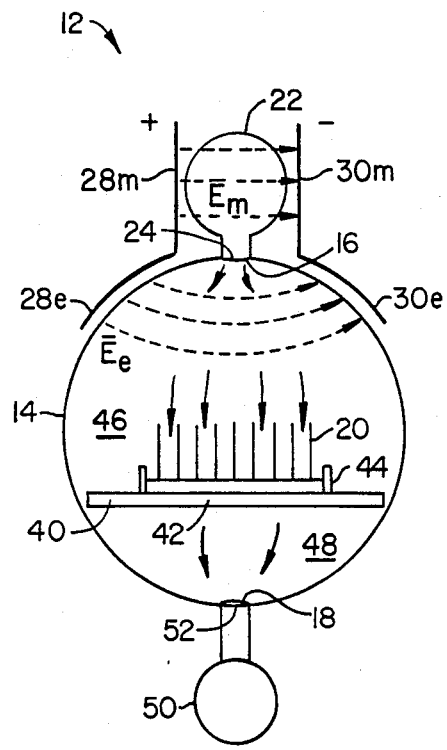
FIG._3.
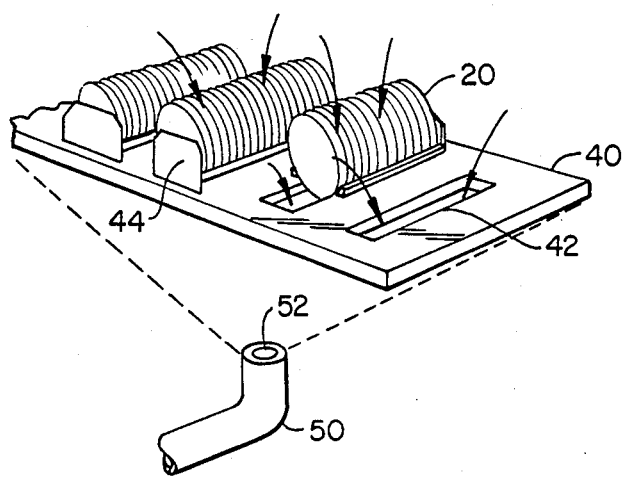
FIG._4.

PLASMA REACTOR AND METHODS FOR USE

This application is a continuation-in-part of application Ser. No. 698,357 pending, filed on Feb. 5, 1985 and assigned to a common assignee as the present application.

TECHNICAL FIELD

This invention relates to plasma reactors, and more particularly, to plasma barrel reactors for removing the photoresist from semiconductor wafers or etching thin films such as aluminum, silicon dioxide or polysilicon on silicon wafers patterned with photoresist for etching, or for cleaning organic scums, films, or epoxy glass from circuit boards and magnetic recording discs. With ammonia as the plasma, the reactor can be used to case harden alloys.

BACKGROUND ART

The use of gas plasma for processing semiconductor wafers is common in the art. For example, various techniques are described in J. Hollahan and A. Bell, *Techniques and Applications of Plasma Chemistry*, Ch. 9 (1974).

Semiconductor components are fabricated on a semiconductive substrate or wafer. The material of the wafer is generally silicon. In manufacturing semiconductor devices, a photosensitive polymer, generally referred to as a photoresist, is used. After selective exposure to optical radiation and subsequent chemical development, the photoresist hardens where it has not been removed and protects the underlying wafer from other chemicals. One method of removing photoresist from wafers after it has served its protective function is by using a gas plasma.

In general, the gas plasma used in removing photoresist is oxygen. More particularly, diatomic oxygen is first exposed to an electric field which transforms some of the diatomic oxygen into an oxygen plasma that contains some monoatomic oxygen, generally referred to as atomic oxygen. Atomic oxygen is capable of reacting with the photoresist by breaking its polymer chains such that the photoresist is removed from the semiconductor wafer by the combined action of the atomic oxygen and the molecular oxygen. The resultant by-products are gases such as $H_2O$, $CO$ and $CO_2$.

Prior art oxygen plasma reactors for removing photoresist, an example of which is shown in FIG. 2A, consist of a cylindrical quartz reactor. A plurality of semiconductor wafers, each of which has a layer of photoresist on its surfaces, are positioned within the reactor. Metal electrodes are positioned around the reactor, one of which is connected to a radio-frequency (RF) generator operating at 13.56 MHz or some harmonic of that frequency and the other is connected to the ground. The quartz reactor also includes a gas input manifold and an exhaust manifold.

Other prior art plasma reactors, not shown, include single-chamber reactor that has an electrode within the chamber, as best exemplified in U.S. Pat. No. 4,230,515. In addition, prior art reactors include double-chamber reactor in which the plasma is generated in one chamber and the work such as photoresist removal is performed in a second chamber. The plasma may be transported between the two chambers either through a narrow channel or through narrow tubes. The primary disadvantage of the double-chamber reactor is the likelihood of plasma degeneration before it could perform the removal of the photoresist, that is, atomic oxygen tends to recombine to diatomic oxygen on the walls of the channel or tubes.

In prior single chamber reactors with external electrodes, the electrodes are wrapped around the entire sides of the cylindrical reactor so that the electric field fills the whole volume of the reactor. However, due to the electrical skin effect of the RF discharge, the electric current produced tends to "hug" the reactor wall. This effect is analogous to the phenomena of high frequency current flowing near the surface or skin of a metal conductor. Thus, most of the atomic oxygen is produced near the walls of the reactor and is pumped out of the reactor without getting near the wafers. The only atomic oxygen that is involved with the removal process is that which diffused into the center of the reactor where the wafers are placed and then diffusing between the wafers.

DISCLOSURE OF THE INVENTION

In view of such deficiencies in the prior art, it is a major object of the present invention to provide a plasma reactor that is capable of maximizing the use of the products of the plasma in performing the desired chemistry. In the instance of photoresist removal, maximizing the reaction of the atomic oxygen with the photoresist.

In order to accomplish the above and still further objects, the present invention provides a plasma reactor that has a working chamber with at least one entry port, the entry port is adapted to receive a working gas into the working chamber. In addition, the working chamber is adapted to receive at least one article. An electrical energy generator is provided. At least one pair of electrodes are positioned adjacent the working chamber entry port. The electrodes, which are connected to the generator, create an electric field adjacent the entry port that converts the working gas into a working plasma for interacting with a material of the article. The position of the electric field adjacent the entry port leaves a substantially electric field-free region in the barrel chamber adjacent the article.

In addition, the plasma reactor of the present invention includes a plasma flow constraint member which is positioned within the working chamber. The constraint member permits the flow of the gas only through itself so as to enhance the interaction of the gas with the material of the article. More particularly, the constraint member includes at least one opening that is adapted to receive the article and to permit the passage of the gas.

It should be noted that as long as the material being processed is placed in the center of the electric field used to create the plasma, the species of interest will be generated and will flow around the sides of the material being processed without reacting with it to an appreciable extent. By generating the plasma upstream of the material being process, it is easy to force the species of interest to flow adjacent the material being processed. This must be done without passing the flow through narrow constrictions which will exterminate the species of interest.

In the preferred embodiment of the present invention, the material of the article that is removed by the working plasma is photoresist. In addition, the article is a semiconductor wafer and the working plasma consists of oxygen.

It is also possible to utilize the plasma barrel reactor for cleaning organic scums, films or epoxy glass from circuit boards and magnetic recording discs. With ammonia as the plasma gas, the reactor can be used to case harden alloys.

Other objects, features, and advantages of the present invention will appear from the following detailed description of the best mode of a preferred embodiment, taken together with the accompanying drawings.

BRIEF DESCRIPTION OF THE DRAWINGS

FIG. 1 is a perspective view of the plasma barrel reactor of the present invention;

FIG. 2 is a partial, cross-sectional, and diagrammatical view of a prior art plasma reactor;

FIG. 3 is a partial, cross-sectional, and diagrammatical view of the plasma barrel reactor of FIG. 1; and FIG. 4 is a partial, cross-sectional, and diagrammatical view of the plasma flow constraint member of the plasma barrel reactor of FIGS. 1 and 3.

BEST MODE FOR CARRYING OUT THE INVENTION

In a plasma the electric field interacts with the gas molecules to generate a wide variety of highly reactive species, including electrons, positive ions, neutral atoms and molecules in both ground and excited states. As a result, the reactions which occur in a plasma are often complex and differ markedly from those occurring under normal conditions. Gases which combine only at elevated temperatures react near room temperature in a glow discharge. Solid surfaces can be sputtered away by bombardment of the energetic species or can react with them to form new substances.

In the area of semiconductor fabrication, several plasma reactions currently enjoy industrial applications. For example, plasma technology is now being applied in production for photoresist removal, etching of silicon compounds, and sequential processing. Additional work has focussed upon the use of plasmas to deposit and grow dielectric films for use on semiconductor devices as diffusion masks, passivation and insulation films.

The use of oxygen plasma to remove photo-resist from wafers has been described in J. Hollahan and A. Bell, *Techniques and Applications of Plasma Chemistry*, Ch. 9 (1974); James F. Battey, "Design Criteria for Uniform Reaction Rates in an Oxygen Plasma," IEEE Transactions on Electron Devices, 24, p. 140, February 1977.

Another area in which plasma reactions enjoy commercial application is in plasma etching. It is known that fluorine-containing gases react with refractory metal oxides at high temperatures to form volatile metal compounds. For example, $$CF_4 \longrightarrow C^\circ + 4F^\circ$$

$$\longrightarrow :CF_2 + 2F^\circ$$

$$4F^\circ + SiO_2 \longrightarrow SiF^\circ + 2O^\circ$$

It is also known that fluorine species in the plasma may react with silicon nitride and silicon:

$$12F^\cdot + Si_3N_4 \rightarrow 3SiF_4 + 2N^2$$

$$4F^\cdot + Si \rightarrow SiF_4\cdot$$

The use of energy-activated carbon tetrafluoride to etch aluminum is disclosed in U.S. Pat. No. 4,182,646 to Zajac.

Hollahan and Bell note that several very important processes can be accomplished by plasma-etching. The first is final passivation glass-etching to expose aluminum wire-bonding pads and the silicon scribe grid. The second etching operation noted by Hollahan and Bell involves the opening of diffusion windows in the fabrication of light emitting diodes on gallium arsenide or gallium arsenide phosphide wafers. Silicon nitride and silicon dioxide layers are deposited on the substrates as diffusion masks. The layers are only 500–1500 Angstroms thick and require only a 3–10 minute etch to open the windows.

Another application of plasma etching in semiconductor fabrication is etching of polysilicon in e.g., IGFET manufacture using carbon tetrafluoride as the working plasma. See, e.g., A. G. Milnes, *Semi-conductor Devices and Integrated Electronics*, page 416, Van Nostrand Reinhold, New York, 1980.

Outside of the semiconductor fabrication area, plasma etching can be used to etch the epoxy glass backing on circuit boards where the epoxy glass has smeared over the inner metallization during drilling of multi-layer boards. The holes are used to make electrical contact between the metallizing on the various layers. A carbon tetrafluoride and an oxygen plasma can be used to etch away the epoxy glass which is obscuring the metal in the holes.

Plasma processes can also be used to clean or descum integrated circuit boards or magnetic recording discs. An oxygen plasma is used to react with substantially organic contaminants to yield a clean and receptive surface.

Moving still further away from the semi-conductor fabrication field, plasma processes are useful in imparting hydrophobicity or hydrophilicity to the surface of hydrocarbon based plastics. One example is the use of this treatment to make ink adhere to the barrels of hypodermic syringes which are made from plastics. Another example involves using plasma processing to improve the adherence of metal pins to rubber surfaces in multi-pin connectors.

Yet another application of plasma processing involves the case hardening of metals by intruding the metal surface with active nitrogen. Active nitrogen can be supplied by using ammonia as the plasma. The nitriding process is carried out by heating the steels while in contact with the energy-activated ammonia plasma. Under these conditions, nitrides form if the steel contains alloying elements such as aluminum, chromium, molybdenum, vanadium and tungsten. The formation of alloy nitrides at the nitriding temperature accounts for the hardened case. Among the parts nitrided for improved wear resistance are cam-shafts, fuel injection pump parts, gears, cylinder barrels, boring bars, spindles, splicers, sprockets, valve stems and milling cutters.

The working plasmas of the present invention may be selected from a wide group of gases, including, but not limited to, $N_2O$, $CCl_4$, $O_2$, $CF_4$, $NH_3$, He, $SF_6$, $N_2$, $BCl_3$, Ar and $H_2$.

While all of the above-described plasma reactions and processes may be performed with the method and apparatus of the instant invention, the invention will be described with reference to a particularly preferred embodiment involving the oxygen plasma removal of photoresist.

Referring to FIG. 1, there is shown a plasma barrel reactor, generally designated 12. Reactor 12 includes a generally barrel-like, cylindrical working chamber 14. Barrel chamber 14 may have a diameter from six to 12 inches; the diameter of chamber 14 is 12 inches in the preferred embodiment. The axial length of chamber 14 is approximately 21 inches. Chamber 14 has a plurality of entry ports 16 for receiving a working gas and a plurality of exhaust ports 18 for venting various gases and by-products of chamber 14. There are four entry ports 16 and five exhaust ports 18 in the preferred embodiment. Moreover, entry ports 16, as best illustrated in FIG. 3, are positioned diametrically opposite exhaust ports 18. Chamber 14, in the preferred embodiment, is made from a conventional inert material such as quartz.

Chamber 14 is adapted to receive a plurality of articles 20. Articles 20, as shown, are semiconductor wafers each of which has a layer of photoresist material on it when the wafers are placed in chamber 14.

Reactor 12 further includes an entry gas manifold 22 that is positioned adjacent chamber 14. Entry gas manifold 22 is a tube, also made of quartz that has a plurality of ports 24 each of which is in communication with one of the barrel chamber entry ports 16. Entry gas manifold 22 in the preferred embodiment has four ports 24. Entry gas manifold 22 is capable of transporting the working gas to barrel chamber 14.

A radio-frequency (RF) electrical energy generator, not shown, is provided. In the preferred embodiment, the frequency of the RF energy is 13.56 MHz.

In addition, reactor 12 includes a pair of entry port electrodes 28e and 30e which are positioned adjacent barrel chamber entry ports 16, as best shown in FIG. 3. Each of the electrodes 28e and 30e, which are manufactured from a conductive metal such as copper, contains a slight curvature in its design such that it follows the curvature of chamber 14. Electrodes 28e and 30e are capable of creating an electric field in barrel chamber 14 adjacent entry ports 16. This entry port electric field $E_e$ then converts the working gas to a working plasma. Moreover, the position of entry port electric field $E_e$ delineates a substantially electric field-free region FR in chamber 14 adjacent articles 20.

A pair of manifold electrodes 28m and 30m, which are positioned adjacent entry gas manifold 22, is also provided. Each of the manifold electrodes 28m and 30m is a generally vertically-extending plate that is positioned at either side of manifold 22, as best shown in FIG. 3. Electrodes 28m and 30m are also manufactured from a conductive metal such as copper. Manifold electrodes 28m and 30m are capable of creating an electric field in manifold 22. The manifold electric field $E_m$ converts a portion of the working gas to the working plasma before the working gas enters chamber 14. The combined effort of the manifold electric field $E_m$ and the entry port electric field $E_e$ efficaciously convert the working gas to the desired working plasma.

Although electrodes 28e and 28m and electrodes 30e and 30m are claimed and described as separate and discrete electrodes, electrodes 28e and 28m could be manufactured as a single electrode and electrodes 30e and 30m as a single electrode. In addition, manifold electrodes 28m and 30m need not be required in all instances. Although the manifold electric field $E_m$ generated by electrodes 28m and 30m does contribute to the efficacious conversion of the working gas to the working plasma, its elimination does not detract the overall conversion of the working gas to the working plasma made by the entry port electric field $E_e$ alone.

Reactor 12 also includes a plasma flow constraint member 40 that is positioned within barrel chamber 14. Constraint member 40 is a planar, board-like platform which has a plurality of openings 42. Openings 42 perform two functions the first of which is to receive wafers 20. Wafers 20 are first placed into a conventional wafer receptacle 44, which is generally referred to as a wafer boat. Each wafer boat 44 is capable of receiving a plurality of wafers, as best shown in FIG. 5. The wafers in boat 44 are spaced apart sufficiently so as to permit the atomic oxygen to flow among them and react with the photoresist which are on the wafers. Boat 44, which is manufactured from an inert material such as quartz, is then received in opening 42.

The next, and more important, function of platform 40 is to restrict the flow of the working gas, and direct it only to wafers 20. The working gas ceases to be a plasma when it leaves the electric field. In prior art reactor such as that shown in FIG. 2, a substantial amount of the working gas or in this instance, plasma, may never come in contact with wafers 120. This is due to the fact there is sufficient space in chamber 114 to permit the free drift of plasma. In contrast, platform 40 is configured such that it divides chamber 14 into two regions, a working region 46 and an exhaust region 48. The only communication between these two regions is through openings 42. This design forces the working gas to pass only through openings 42, which are positioned immediately below wafers 20. This causes all of the plasma to flow through wafers 20 and react with the photoresist. Platform 42, which has dimensions of approximately 21 inches×9 inches×⅛ inch, is manufactured from a non-reactive material such as hard anodized aluminum. Platform 42 may also be manufactured from quartz.

Reactor 12 further includes an exhaust manifold 50 that is positioned adjacent chamber 14. Exhaust manifold 50 is a tube, also made of quartz, that has a plurality of ports 52 each of which is in communication with one of the barrel chamber exhaust ports 18. Exhaust manifold 50 of the preferred embodiment has five ports 52. Exhaust manifold 50 is capable of transporting away from chamber 14 any remaining working plasma along with gaseous by-products of the plasma-photoresist reaction.

In use, wafer boats 44 each of which contain a plurality of wafers 20 are first placed in openings 42 of platform 40. Chamber 14 is then evacuated to a moderate vacuum, approximately 1/1000 of an atmosphere. The evacuation is accomplished by a conventional pump, not shown, that is connected to exhaust manifold 50. Diatomic oxygen, the working gas, is admitted to chamber 14 via entry gas manifold 22. A source of diatomic oxygen, not shown, is connected to entry gas manifold 22.

The RF generator is then activated, causing electrodes 28e, 28m, 30e and 30m to generate electric fields in both entry gas manifold 22 and chamber 14. The electric fields produced, $E_e$ and $E_m$, decompose diatomic oxygen to monoatomic oxygen, the working gas. The electric field in manifold 22 converts a small portion of the working gas into plasma before the gas enters ports 16 of the chamber 14. The remaining portion of the working gas is converted to plasma by the electric field that is adjacent entry chamber ports 16. The position of the entry port electric field $E_e$ forces all of the working gas to pass through the field, enhancing the conversion of gas to plasma.

As the working gas travels through chamber 14, its route of travel is dictated by constraint platform 40. Instead of meandering around in chamber 14, which is the case for plasma in prior art chambers, it can only exit by passing through openings 42. Since wafers 20 are positioned immediately above openings 42, all of the plasma must pass through wafers 20. Since this enhances the number of oxygen-photoresist interactions, the time for completing the entire photoresist removal process is reduced.

It will be apparent to those skilled in the art that various modifications may be made within the spirit of the invention and the scope of the appended claims.

We claim:

1. A plasma reactor, comprising
a working chamber having at least one entry port for receiving a working gas into said working chamber, and at least one exit port for exhausting gas from said working chamber, said working chamber adapted to receive at least one article;
an electrical energy generator;
at least one pair of electrodes positioned about said working chamber, said electrodes, which are connected to said generator, create an electric field that converts said working gas into a working plasma;
a plasma flow constraint member, positioned within said working chamber, said member being a planar, board-like platform having at least one article-receiving opening whereby said articles are disposed upon said platform and whereby said constraint member permits the flow of said working plasma from said entry port to said exit port only through itself such that substantially all of the working plasma passes onto the articles and through the constraint member openings so as to enhance the interaction of said working plasma with a material of said article.

2. A plasma reactor as in claim 1 wherein said plasma is a member selected from the group consisting of $O_2$, $NH_3$, $CF_4$, $N_2O$, $CCl_4$, He, $SF_6$, $N_2$, $BCl_3$, Ar and $H_2$.

3. A plasma reactor as in claim 1 wherein said article is a printed circuit board.

4. A plasma reactor as in claim 1 wherein said article is a magnetic recording disc.

5. A plasma reactor as in claim 1 wherein said article is a member selected from the group consisting of camshafts, fuel injection pump parts, gears, cylinder barrels, boring bars, spindles, slicers, sprockets, valve stems and milling cutters.

6. A plasma reactor as in claim 1 wherein the material of said article is epoxy glass.

7. A plasma reactor as in claim 1 wherein the material of said article is hydrocarbon plastic.

8. A plasma reactor as in claim 1 wherein the material of said article is at least one member of the group consisting of chromium, molybdenum, vanadium, tungsten, aluminum, polysilicon, silicon dioxide and silicon nitride.

9. A plasma reactor as in claim 1 wherein the material of said article is a film of organic contaminants.

10. An elongate plasma barrel reactor, comprising
a generally barrel-like working chamber having at least one entry port and at least one exit port, said barrel chamber adapted to receive at least one article;
an entry gas manifold positioned adjacent said barrel chamber, said entry gas manifold having at least one port that communicates with said barrel chamber entry port, said entry gas manifold adapted to transport a working gas to said barrel chamber;
a radio-frequency electrical energy generator;
at least one pair of entry port electrodes positioned adjacent said barrel chamber entry port, said electrodes, which are connected to said generator, create an electric field in said barrel chamber adjacent said entry port that convert said working gas into a working plasma;
at least one pair of manifold electrodes positioned adjacent said entry gas manifold, said manifold electrodes, which are also connected to said generator, create an electric field in said manifold that converts a portion of said working gas into a working plasma before said working gas enters said barrel chamber, whereby said manifold electric field and said entry port electric field efficaciously convert said working gas to said working plasma;
an exhaust gas manifold positioned adjacent said barrel chamber, said exhaust gas manifold having at least one port that communicates with said barrel chamber exit port, said exhaust gas manifold is adapted to transport working gas out of said barrel chamber; and
a plasma flow constraint member positioned within said barrel chamber in a substantially electrical field free region of the working chamber for restricting the flow of said working plasma, said constraint member being a planar, board-like platform having at least one article-receiving opening whereby said articles are disposed upon said platform which is disposed in a plane parallel to said reactor longitudinal axis and is positioned between said entry and exhaust ports, and whereby said constraint member permits the flow of said working plasma from said entry port to said exit port only through itself such that substantially all of the working plasma passes onto the articles and through the constraint member opening so as to enhance the interaction of said working plasma with a material of said article.

11. The plasma barrel reactor as claimed in claim 10, wherein
the position of said electric field adjacent said entry port delineates a substantially electric field-free region in said barrel chamber adjacent said article, downstream of the plasma generating region.

12. A plasma reactor as in claim 10 or 11 wherein said plasma is a member selected from the group consisting of $O_2$, $NH_3$, $CF_4$, $N_2O$, $CCl_4$, He, $SF_6$, $N_2$, $BCl_3$, Ar and $H_2$.

13. A plasma reactor as in claim 10 or 11 wherein said article is a printed circuit board.

14. A plasma reactor as in claim 10 or 11 wherein said article is a magnetic recording disc.

15. A plasma reactor as in claim 10 or 11 wherein said article is a member selected from the group consisting of camshafts, fuel injection pump parts, gears, cylinder barrels, boring bars, spindles, slicers, sprockets, valve stems and milling cutters.

16. A plasma reactor as in claim 10 or 11 wherein the material of said article is epoxy glass.

17. A plasma reactor as in claim 10 or 11 wherein the material of said article is hydrocarbon plastic.

18. A plasma reactor as in claim 10 or 11 wherein the material of said article is at least one member of the group consisting of chromium, molybdenum, vanadium, tungsten, aluminum, polysilicon, silicon dioxide and silicon nitride.

19. A plasma reactor as in claim 10 or 11 wherein the material of said article is a film of organic contaminants.

20. A method of interacting a working plasma with an article which is positioned within a generally barrel-like working chamber having at least one entry port and at least one exit port comprising the steps of
    positioning said article in a working position within said chamber;
    introducing a working gas into said chamber through said entry port remote from said working position;
    establishing an electric field in said chamber for converting said working gas into said working plasma for interacting with a material of said article;
    confining said electric field to an upper region of said chamber immediately adjacent to said entry port where said working gas is introduced into said working chamber;
    maintaining a lower region of said chamber in a substantially electric-field free condition, said working position lying entirely within said lower region; and
    restricting the flow of said working plasma about said working position by providing a constraint member which is a planar, board-like platform having at least one article-receiving opening whereby said articles are disposed upon said platform, such that as the plasma flows from the upper region to the lower region toward the exit port, substantially all of the plasma flows onto said articles through said constraint member openings, so as to enhance the interaction of said working plasma with said material of said article.

21. A method as in claim 20 wherein said plasma is a member selected from the group consisting of $O_2$, $NH_3$, $CF_4$, $N_2O$, $CCl_4$, He, $SF_6$, $N_2$, $BCl_3$, Ar and $H_2$.

22. A method as in claim 20 wherein said article is a printed circuit board.

23. A method as in claim 20 wherein said article is a magnetic recording disc.

24. A method as in claim 20 wherein said article is a member selected from the group consisting of camshafts, fuel injection pump parts, gear, cylinder barrels, boring bars, spindles, slicers, sprockets, valve stems and milling cutters.

25. A method as in claim 20 wherein the material of said article is epoxy glass.

26. A method as in claim 20 wherein the material of said article is hydrocarbon plastic.

27. A method as in claim 20 wherein the material of said article is at least one member of the group consisting of chromium, molydbenum, vanadium, tungsten, aluminum, polysilicon, silicon dioxide and silicon nitride.

28. A method as in claim 20 wherein the material of said article is a film of organic contaminants.

29. In a method for interacting a working plasma with an article positioned within a working chamber comprising
    introducing a working gas into said working chamber through at least one entry port remote from said working position;
    establishing an electric field within said chamber for converting said working gas into said working plasma for interacting with a material of said article; and
    exhausting said working gas from said working chamber through at least one exit port;
    wherein the improvement comprises:
    confining said electric field to a first region within said chamber said first region being adjacent said entry port;
    positioning said article within said chamber in a second region adjacent the first region;
    maintaining said second region substantially electric-field free; and
    constraining flow of the working plasma from said first region to said exit port by providing a planar, board-like platform having at least one article-receiving opening whereby substantially all of the working plasma flows directly over the articles in said second, substantially electric-field free region, through said platform openings.

30. A method as in claim 29 wherein said plasma is a member selected from the group consisting of $O_2$, $NH_3$, $CF_4$, $N_2O$, $CCl_4$, He, $SF_6$, $N_2$, $BCl_3$, Ar and $H_2$.

31. A method as in claim 29 wherein said article is a printed circuit board.

32. A method as in claim 29 wherein said article is a magnetic recording disc.

33. A method as in claim 29 wherein said article is a member selected from the group consisting of camshafts, fuel injection pump parts, gears, cylinder barrels, boring bars, spindles, slicers, sprockets, valve stems and milling cutters.

34. A method as in claim 29 wherein the material of said article is epoxy glass.

35. A method as in claim 29 wherein the material of said article is hydrocarbon plastic.

36. A method as in claim 29 wherein the material of said article is at least one member of the group consisting of chrominum, molydbenum, vanadium, tungsten, aluminum, polysilicon, silicon dioxide and silicon nitride.

37. A method as in claim 29 wherein the material of said article is a film of organic contaminants.

* * * * *